(12) United States Patent
Poucher et al.

(10) Patent No.: US 6,198,313 B1
(45) Date of Patent: Mar. 6, 2001

(54) INFINITE SAMPLE-AND-HOLD CIRCUIT

(76) Inventors: Patrick F. M. Poucher, 75 Meadowvale; Patrick Kirby, 38 Nessan Court, Church Road, both of Raheen, Limerick; Christopher A. Kenny, New Line Grange; Donal Geraghty, 29 The Moorings, Westbury, both of Corbally, Limerick, all of (IE)

( * ) Notice: Subject to any disclaimer, the term of this patent is extended or adjusted under 35 U.S.C. 154(b) by 0 days.

(21) Appl. No.: 09/082,032

(22) Filed: May 20, 1998

(51) Int. Cl.[7] .................................................. G11C 27/02
(52) U.S. Cl. ............................ 327/91; 341/122; 341/126
(58) Field of Search ................................ 327/91, 94, 95, 327/96, 93; 341/122, 123, 124, 125, 126

(56) References Cited

U.S. PATENT DOCUMENTS

| | | | |
|---|---|---|---|
| 4,527,148 | * 7/1985 | Kuboki et al. | 340/347 |
| 4,609,906 | * 9/1986 | Wiegel | 340/347 |
| 4,868,411 | * 9/1989 | Ishihara | 307/119 |
| 4,980,634 | * 12/1990 | Mallinson | 324/142 |
| 5,457,418 | * 10/1995 | Chang | 327/374 |
| 5,614,854 | 3/1997 | Kuga | 327/94 |
| 5,831,562 | * 11/1998 | Van Auken et al. | 341/122 |

OTHER PUBLICATIONS

"Octal Sample–and–Hold with Multiplexed Input", Analog Devices, SMP08. 1996.

"Application of the ADC1210 CMOS A/D Converter", National Semiconductor Corporation, Application Note 245, Apr. 1986, pp. 1–8.

"Special Sample and Hold Techniques", National Semiconductor Corporation, Application Note 294, Apr. 1982, pp. 1–4.

* cited by examiner

Primary Examiner—Timothy P. Callahan
Assistant Examiner—Hai L. Nguyen
(74) Attorney, Agent, or Firm—Wolf, Greenfield & Sacks, P.C.

(57) ABSTRACT

An infinite sample-and-hold circuit which employs a DAC and an ADC coupled with a mode control circuit. In acquisition mode, the mode control circuit connects the analog input signal to the ADC. The ADC drives the DAC and when the DAC output equals the analog input, the mode control circuit disconnects the analog input and the DAC drives the output in hold mode. The mode control circuit preferably includes a comparator/buffer circuit including switching circuitry. The ADC is preferably of the successive approximation type. The comparator/buffer is used in two modes: (1) open loop, as a comparator, and (2) closed loop, as a buffer. During acquisition, the comparator mode is used, while in hold mode the buffer mode is used. The utilization of the same amplifier to provide both functions allows cancellation of offset errors otherwise introduced by the comparator and buffer, at least to a first order.

8 Claims, 5 Drawing Sheets

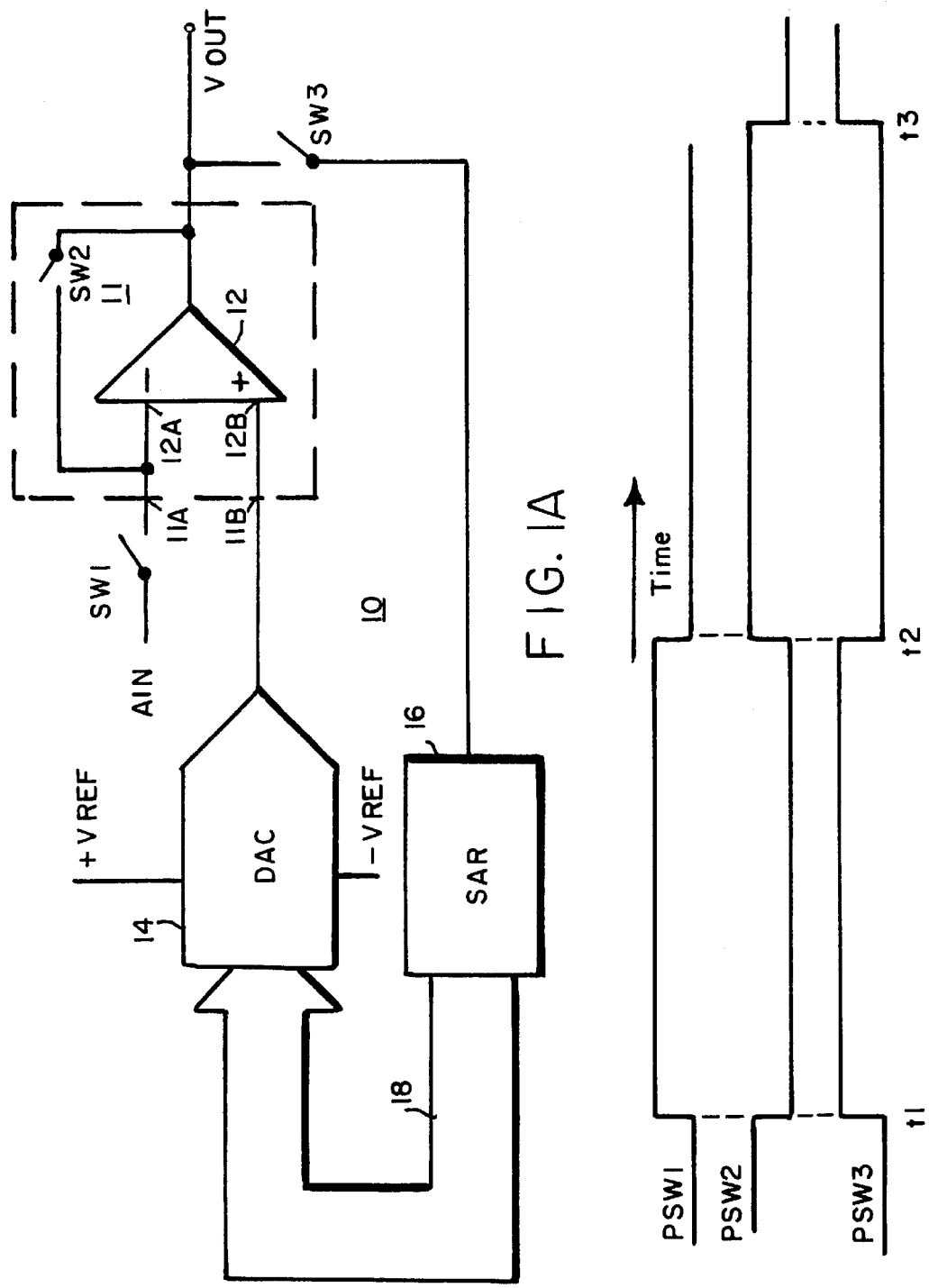

INFINITE SAMPLE-AND-HOLD CIRCUIT

FIELD OF THE INVENTION

This invention relates to sample-and-hold circuits for use in electronic systems. More particularly, it relates to so-called infinite sample-and-hold circuits and their uses. These uses include, among others, demultiplexing an analog input signal (e.g., a voltage or voltages from a DAC) to multiple outputs at which the signal value may be held for an indefinite (colloquially, "infinite") duration. Such application is particularly useful in test systems, to set multiple voltages from a single DAC.

BACKGROUND OF INVENTION

Sample-and-hold circuits (also called sample-and-hold amplifiers, and abbreviated in the singular as an "sha") are widely used in electronic systems, particularly where it is necessary to convert an analog signal into a digital stream or into a digital word for further processing.

In many applications, it is desired that the sample-and-hold circuitry hold on its output for a considerable time the value of the sampled input signal. Frequently, the analog signal (which may be a voltage or a current but is shown in the illustrations herein as a voltage) is sampled onto a capacitor which is used to hold the sampled value or a voltage representing same. A problem exists in the use of such capacitor-based circuits, however, in that the analog voltage level stored on a holding capacitor will "droop"— i.e., steadily fall—over the hold interval, principally as a result of current leakage. Attempts have been made to minimize the impact of this droop by improving the quality of hold capacitors and by ensuring that the holding capacitors are connected to buffers specially designed to draw negligible input current. Also, the capacitance may be increased to reduce droop, but this has a negative impact on the circuit's ability to process high speed signals.

In capacitor-based sample-and-hold circuits, therefore, if the sampled value must be stored for any significant amount of time, the capacitor must be periodically recharged by highly accurate sub-circuits, to refresh the held voltage. This imposes an undesirable overhead on the circuitry and is particularly problematic in situations where a number of sample-and-hold circuits are used, requiring regular polling to refresh stored charges and possibly slowing down the overall operation.

Of particular note, it is sometimes desirable to be able to hold a series of analog sample values of an input signal, and that the held values be—and remain during a long hold period—highly accurate representations of the input at the time of sampling. Using capacitor-based circuitry requires at least one holding capacitor for each sample, in addition to the requisite refresh circuitry. Holding capacitors, however, typically are physically large elements and occupy a considerable amount of area on a die if they are fabricated monolithically with the circuitry. This limits the area available for other components and circuits and raises the cost of the product in which the sample-and-hold circuits are used. If capacitors external to the die are employed, they add substantial cost and physical size as well as introducing unwanted temperature dependencies.

To this end, there have been developed certain so-called "infinite" sample-and-hold circuits ("ISHA") wherein a digital-to-analog converter generates analog voltage which is compared with an input analog signal and a control circuit forces the generated analog voltage to equal the input analog voltage. The generated analog voltage may then be maintained by maintaining the digital code input to the DAC. However, the DAC may introduce linearity errors, making it difficult to reproduce accurately the input analog signal.

As shown in National Semiconductor's application note publication AN-294, one approach to providing an infinite sample-and-hold amplifier uses a separate ADC and DAC in combination with external circuitry. The disclosed approach, however, requires a large number of discrete components. Further, the accuracy of the system is limited by the accuracy of the two converters; to achieve greater than eight-bit accuracy requires expensive components. Additionally, offset errors in the converters and output buffer, together with gain errors, all combine to reduce the ability to accurately reproduce the input voltage at the output.

Even when the components for such an ISHA are integrated into a single chip, the overall accuracy is still limited by the converters and by the matching between the ADC and DAC.

A variation on this approach is shown in National Semiconductor's application note AN-245. There, the architecture employs a DAC, a successive approximation register (SAR) and a comparator to converge the output voltage to the input sample. However, this approach requires multiple external components and suffers due to offset errors, sample and hold droop, and other factors.

Additionally, in certain types of equipment, such as automated test equipment (ATE), it is desirable to employ digital to analog converters (DACs) to generate from digital control signals analog test signals for driving devices to be tested. In such situations, either a DAC is provided for each signal level required or, if a good sample-and-hold circuit is available, a single DAC output is demultiplexed using a (capacitor-based) sample-and-hold circuit for each level needed. The DAC approach requires accurate high resolution DACs, which are expensive, and using capacitor-based sample-and-hold circuits requires extensive refresh circuitry.

SUMMARY OR THE INVENTION

Accordingly, there is shown herein an infinite sample-and-hold circuit which does not suffer from the aforementioned disadvantages. Such a sample-and-hold circuit will hold a sampled analog voltage (or, equivalently, a voltage representing a sample analog current) indefinitely without the need for refresh circuitry, and does not rely on external components such as capacitors or on highly accurate compensation sub-circuits.

One aspect of the invention is an infinite sample-and-hold circuit which employs a DAC and an ADC coupled with a mode control circuit. In acquisition mode, the mode control circuit connects the analog input signal to the ADC. The ADC drives the DAC and when the DAC output equals the analog input, the mode control circuit disconnects the analog input and the DAC drives the output in hold mode. The mode control circuit preferably includes a comparator/buffer circuit including switching circuitry.

Another aspect of the invention is an infinite sample-and-hold circuit comprising a DAC with good differential non-linearity (DNL) performance, in conjunction with a SAR, to converge an output to an analog input value. Both the digital input to the DAC and the analog DAC output may be available externally. (Having the digital input of the DAC available externally allows the DAC output to be driven to a predetermined value established by a digital input word. For example, this may be a test signal value or a value it is desired to reproduce from a corresponding, previously supplied analog input signal.) The DAC has a buffer stage (or, more properly, a comparator/buffer stage) which is used in two modes: (1) open loop, as a comparator, and (2) closed loop, as a buffer. During acquisition, the comparator mode is used, while in hold mode the buffer mode is used. The utilization of the same amplifier to provide both functions allows cancellation of offset errors otherwise introduced by the comparator and buffer, at least to a first order.

According to another aspect of the invention, an ISHA includes a switching mechanism which allows the analog input to be switched to the ISHA output during sampling (i.e., acquisition). This allows the output to be controlled during acquisition and allows the output circuitry to slew and settle during the acquisition process.

According to a further aspect, the invention includes, in combination with one of the previous aspects, an output buffer and a switching mechanism which prevent the input being loaded by the output load during acquisition.

Yet another aspect of the invention is an ISHA according one of the previous aspects in combination with an input buffer which prevents the input from being loaded by the output load during acquisition.

According to another aspect of the invention, there is provided an arrangement of ISHAs according to one of the previous aspects, arranged such that one or more analog inputs can be acquired on one or more analog outputs.

In a further aspect of the invention, there is provided in one or more ISHAs according to the foregoing aspects accessibility for reading the digital code to which the DAC converges after an acquisition. This code may be transmitted to the DAC at another time, to return the ISHA output to the acquired level.

Still another aspect of the invention is an ISHA according to one of the previous aspects, wherein there is further provided an input tracking mechanism which is controllable by an input signal applied thereto, to allow the analog input to be buffered to the output without acquisition.

BRIEF DESCRIPTION OF THE DRAWING

FIG. 1A is a block diagram of a first illustrative embodiment of an infinite sample-and-hold circuit according to the invention;

FIG. 1B is a set of waveforms illustrating control signals for the switches of the circuit of FIG. 1A;

DETAILED DISCLOSURE

Figure 2A:
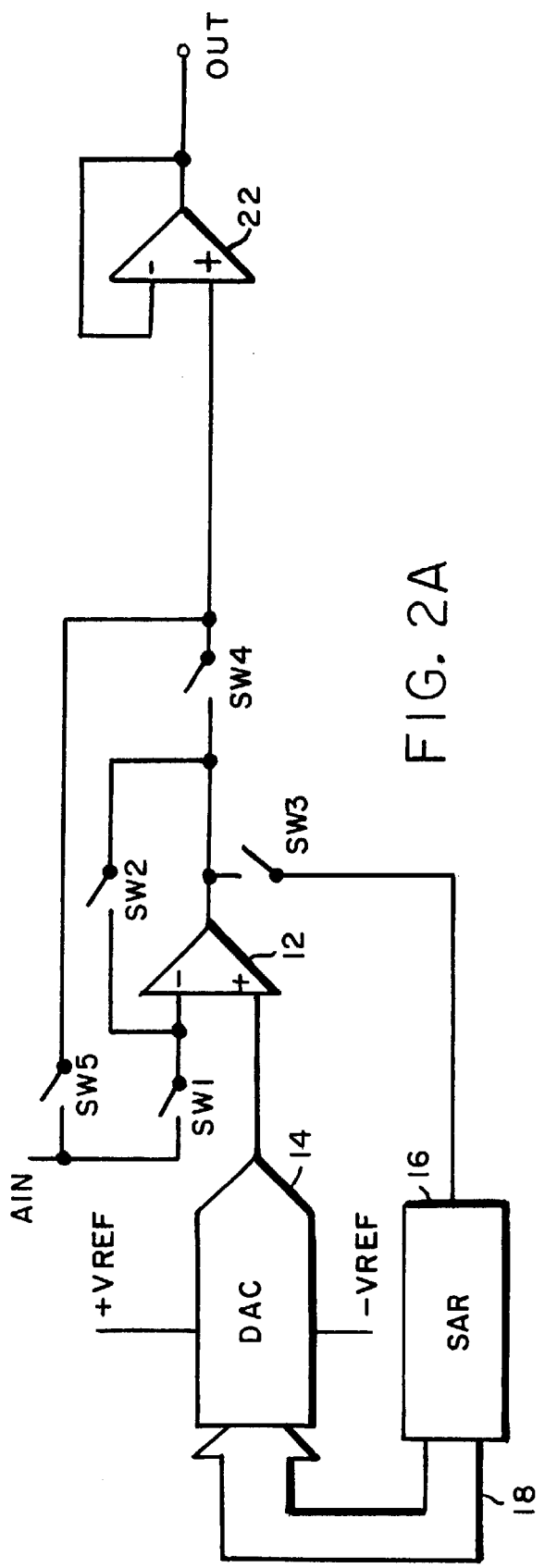
FIG. 2A is a block diagram of a second illustrative embodiment of an infinite sample-and-hold circuit according to the invention.

The invention will be more clearly understood from the following description of an embodiment or embodiments thereof, given by way of example only with reference to the accompanying drawing, being diagrams of infinite sample-and-hold circuits in accordance with the invention. For the purposes of this description, except for switch timing diagrams, specific timing and performance details have been omitted in order to avoid unnecessarily obscuring the present invention. Among the omitted details understood to be needed is circuitry for controlling the states of the switches which define the sampling and hold functions of the infinite sample-and-hold circuits discussed herein.

Referring to FIG. 1A, a first illustrative embodiment of an infinite sample-and-hold circuit according to the invention is illustrated, indicated generally by the reference numeral 10. FIG. 1B is an associated set of waveforms depicting the operation of the switches in FIG. 1A, so FIG. 1A will be explained with reference also to FIG. 1B. Each of switches SW1, SW2, and SW3 is controlled by an associated control signal, respectively designated PSW1, PSW2 and PSW3. When the control signal is high, the switch is closed.

At a time t1, control signal PSW1 goes high, closing switch SW1 and supplying the analog input signal, AIN, to a first input, 11A, of a comparator/buffer stage 11. Comparator/buffer stage 11 is a circuit which can be configured either as a comparator or as a buffer, in response to appropriate control signals. As further shown, the signals (implied but not shown) which control switches SW1 and SW2 may be those control signals, as the states of those switches will determine the function of the comparator/buffer 11. Comparator/buffer input 11A is connected to the inverting input 12A of op-amp 12; thus with switch SW1 closed, the input signal AIN is connected to the inverting input 12A of op-amp 12. Switch SW2, which connects between the inverting input of op-amp 12 and the output of that op-amp, is opened in response to signal PSW2 going low and switch SW3 is closed in response to signal PSW3 going high. Op-amp 12 thus is arranged to act as a comparator, comparing the analog input signal, AIN, with the signal applied to its second input, 11B; that is, the output signal from DAC 14. This signal is supplied to the non-inverting input 12B of op-amp 12. The output of the comparator 12 drives successive approximation logic and, thus, a successive approximation register (SAR) 16 through a switch, SW3. The SAR 16 supplies a digital code on bus 18 to the DAC 14, which code varies in response to an output from the comparator/buffer until the output from the digital to analog converter equals the value of the analog input signal, AIN. (The successive approximation logic which generates the digital code words may use any suitable algorithm, such as a monotonic approach algorithm or a binary search algorithm). Thus, during the interval commencing at t1 and ending before a sufficient time later at t2, the output from DAC 14 is caused to converge on the value of AIN, assuming AIN is relatively constant during that interval. At time t2, all of switches SW1–SW3 change state and the comparator/buffer 12 becomes a buffer. Thus the op-amp 12 is disconnected from the analog input signal and reconfigured as a non-inverting unity gain buffer which presents at its output a buffered replica of the output voltage of DAC 14. The output of DAC 14 is that level which results from the SAR output code; the SAR input being disconnected by SW3 being open, it is the most recent code applied at the instant just prior to t2. At a later instant, t3, the states of switches SW1, SW2 and SW3 may be reset (to the states they assumed at t1), to commence another acquisition (i.e., sampling) operation.

Thus during the interval t1 to t2, which will be termed the acquisition phase (or mode), the circuit 10 operates to sample, or acquire, the analog input signal; and from t2 until switch SW1 is reset, which interval will be termed the infinite hold phase (or mode) the circuit operates to hold at the output a value equal to the sampled value of the input signal.

The analog input signal may come from a variety of sources, including a DAC (not shown). Particularly in a test system, a DAC source may be used so that a reproducible digital code can be generated to stimulate a device under test. An advantage of the present invention is that the digital code on bus 18 also can be read and stored (in a memory, not shown) and then reimposed on the bus at a later time to drive the output value to a desired level without having to wait for the time a successive approximation process requires and without having to have the corresponding analog input signal present. Even if there are considerable nonlinearities in the relationship between the analog input signal value and the code produced by the SAR, nevertheless the relationship will be single valued and storing the code produced by the SAR will allow exact reproduction of the ISHA output at a later time.

Figure 2B:
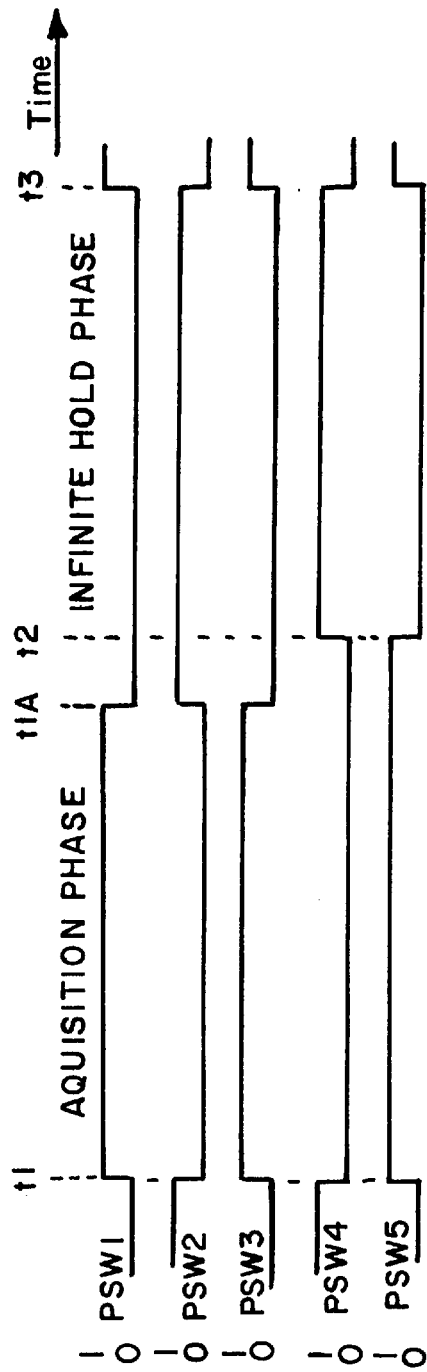
FIG. 2B is a set of waveforms illustrating control signals for the switches of the circuit of FIG. 2A.

A second illustrative embodiment of the invention, 20, and control signals defining its operation, is depicted in FIGS. 2A and 2B. While this embodiment uses the same components as that of FIG. 1A, it differs from the former in the construction of the comparator/buffer 11 and with respect to certain added and changed switching. In an acquisition phase (or mode), from time t1 to time t2, switches SW1, SW3 and SW5 are closed, with switches SW2 and SW4 open. This configures op-amp 12 as a comparator and allows it to drive the successive approximation register 16. During the acquisition phase, switch SW1 is closed and the analog input signal is connected directly to the input of operational amplifier 12. If a binary successive approximation search algorithm is employed, then with switch SW2 open during the acquisition mode, the output of the comparator-configured operational amplifier 12 will alternate between its supply voltages (not indicated, to avoid obfuscation) until the input voltage "target" is reached. At time t1A, the circuit is switched into buffer mode, switches SW1 and SW3 opening and switch SW2 closing. At time t1A, the output of operational amplifier 12 must begin to slew from one of its supply voltages and settle at the newly acquired voltage level at the output of DAC 14. In the absence of switches SW4 and SW5 (which are open and closed, respectively), in the interval from t1A to t2 the slewing and settling of the operational amplifier 12 would be experienced directly at the output of operational amplifier 22. Thus those switches allow the output of operational amplifier (i.e., comparator/buffer) 12 to settle before being used to supply an output signal. In infinite hold mode, commencing at t2, the action of the switches produces exactly the same circuit as in the embodiment of FIG. 1A.

The output from the circuit may be taken from node 24 or, alternatively and optionally, a buffer 22 can be added to the circuit at node 24 and the output can be taken from the output of buffer 22. Use of buffer 22 will ensure that output loads will not load down the input during acquisition and produce resultant distortion; it will also assure that during the hold phase output loading effects, including changes in output load, will not introduce errors in the voltage at node 24.

Note that even if a monotonic successive approximation algorithm is employed, the output of operational amplifier 12 still must settle from one of its supply values to the level of the analog input signal.

However, if the analog circuitry driven by the ISHA can tolerate the slewing of the op-amp output at the end of the acquisition phase, then switches SW4 and SW5 may be omitted.

Figure 3A:
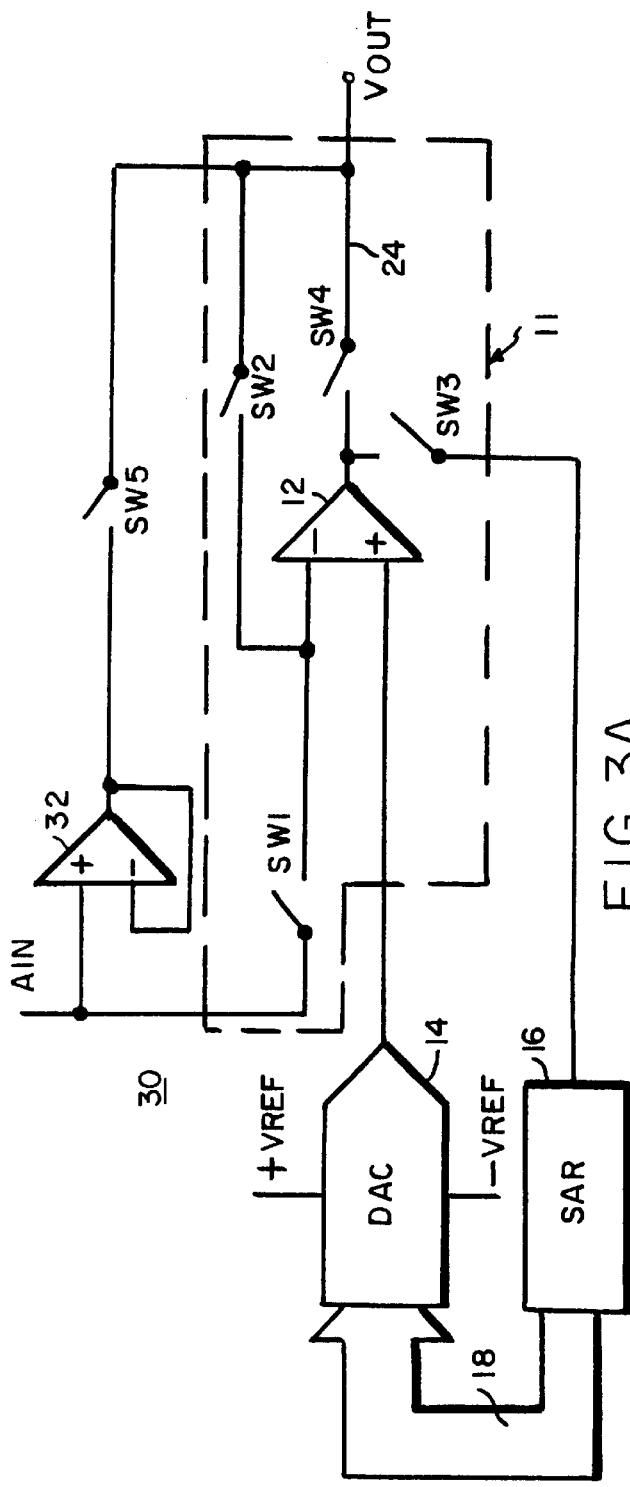
FIG. 3A is a block diagram of a third illustrative embodiment of an infinite sample-and-hold circuit according to the invention.
Figure 3B:
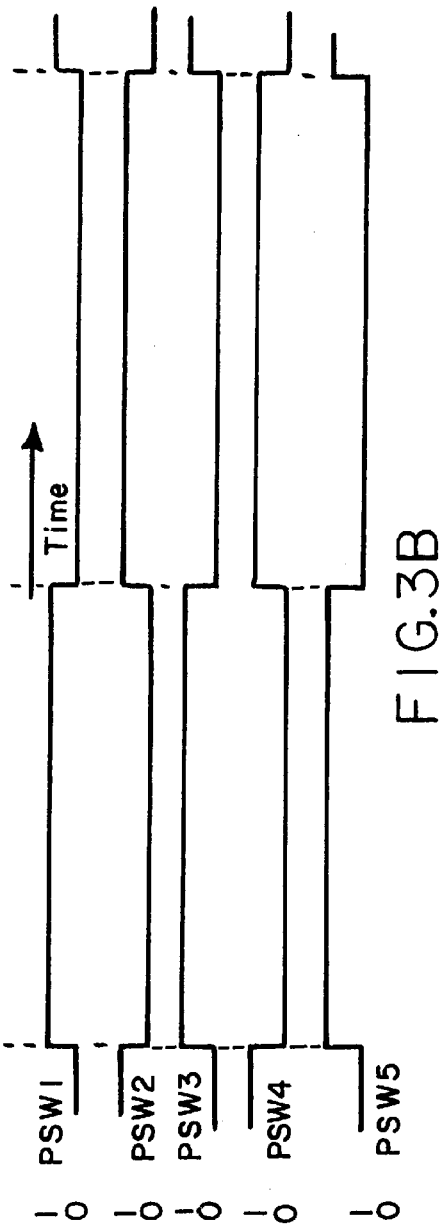
FIG. 3B is a set of waveforms illustrating control signals for the switches of the circuit of FIG. 3A.

Turning to FIGS. 3A and 3B, there is shown yet another exemplary embodiment of an ISHA according to the invention. In this particular embodiment, an input buffer is added, to prevent the input from being loaded by the output load during acquisition.

During acquisition phase, from t1 to t2, the analog input signal AIN is supplied both to a non-inverting unity gain buffer 32 and to the inverting input of op-amp 12, via closed switch SW1. The output of buffer 32 is supplied via closed switch SW5 to the output node 24, so the buffered input signal is fed directly to the output during the acquisition phase. Concurrently, the SAR is fed via switch SW3 and the output of the DAC 14 is servoed to the analog input value. At the end of the acquisition phase, at time t2, switches SW1, SW3 and SW5 open while switches SW2 and SW4 close, yielding a circuit identical to that of FIG. 2A, with the DAC output supplied via a buffer-configured op-amp 12 to the output node 24.

Figure 4:
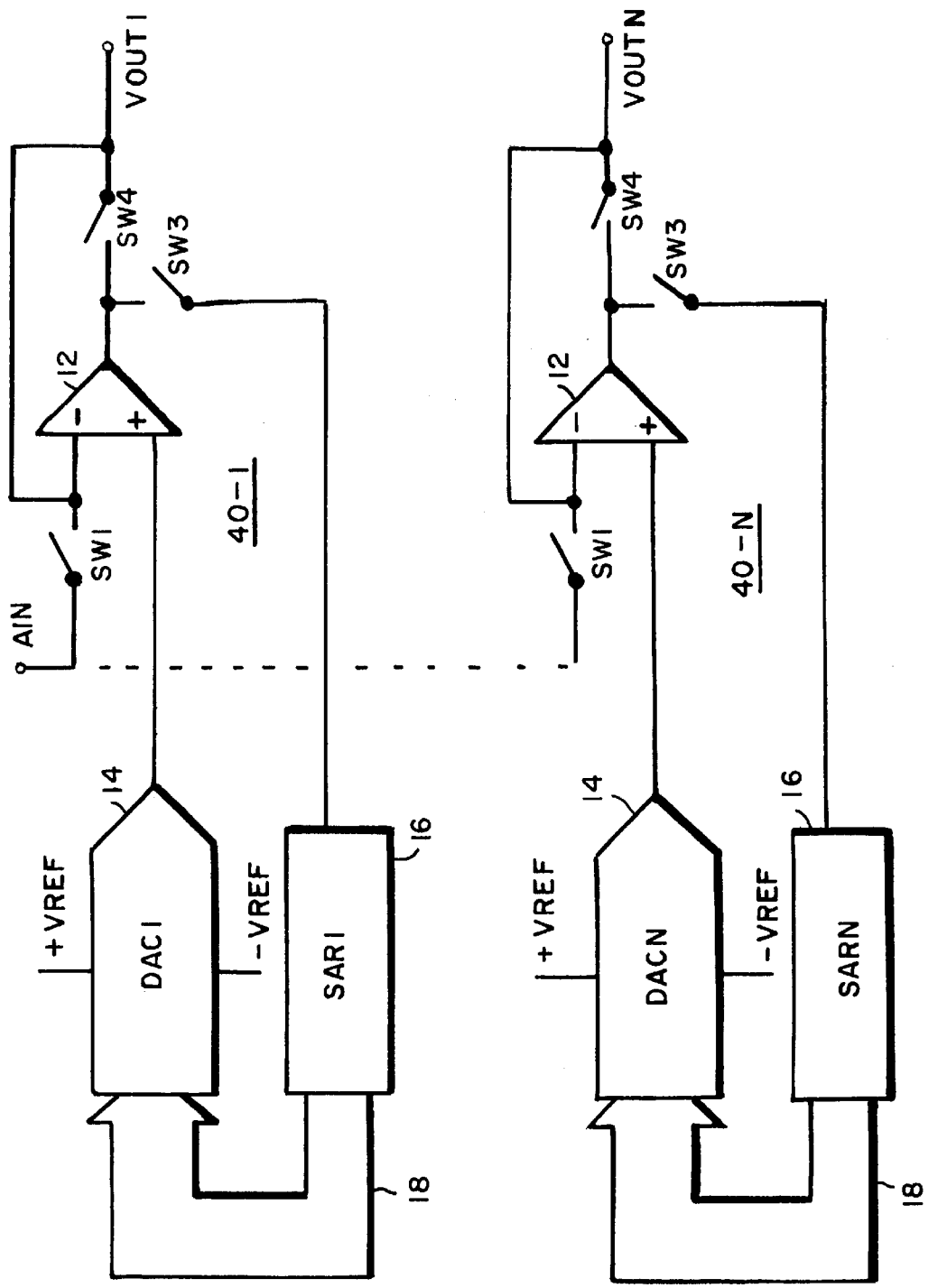
FIG. 4 is a block diagram of an embodiment of the invention employing multiple infinite sample-and-hold circuits to selectively supply sampled signals to multiple outputs.

FIG. 4 illustrates another aspect of the invention, an arrangement of ISHAs according to one of the previous aspects, arranged such that an analog input signal can be acquired on one or more analog outputs. Using as an example the ISHA embodiment of FIG. 2A (without the optional output buffer), there are provided "N" ISHA's 40-1 through 40-N, all having a common input node coupled together in parallel to receive the input signal AIN. If the switches in the individual ISHA's are operated independently, the ISHAs may sample the input signal at different times to provide a variety of output values. Thus an analog input signal (e.g., a voltage or voltages from a DAC, not shown) may be demultiplexed to multiple outputs at which the signal value (or values, if there are multiple samples) may be held for an indefinite (colloquially, "infinite") duration. Such application is particularly useful in test systems, to set multiple voltages from a single DAC. Alternatively, any one or more of the ISHAs may be disabled, and their outputs allowed to float, merely by causing all of their switches to be kept open. By only selectively permitting one or more ISHAs to operate normally, the analog input may be sampled and caused to be held on any desired, selected output.

Since each of the illustrated embodiments of the ISHA has a set of switches which, if opened, will isolate the output node from the input node, any of the illustrated embodiments may be substituted for that used in the arrangement of FIG. 4.

Owing to their common function in the various embodiments, switches SW1 and SW3 may be thought of as part of a comparator/buffer stage including those switches and op-amp 12.

Figure 5:
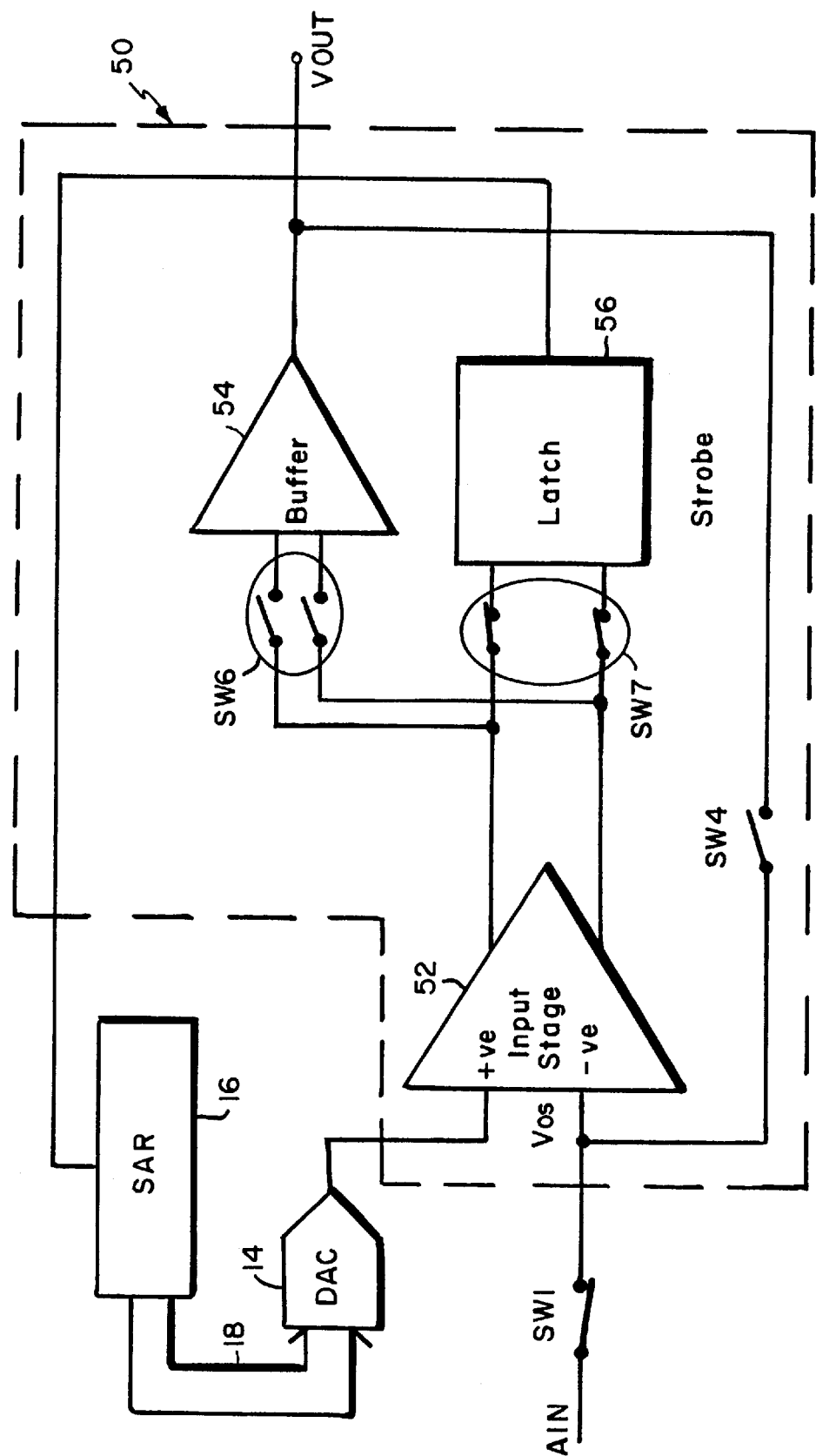
FIG. 5 is a block diagram of an exemplary comparator/buffer stage for use in the infinite sample-and-hold circuits of the present invention.

For purposes of illustrating the architecture of the SAR-DAC-comparator/buffer ISHA according to the invention, the comparator/buffer stage 11 has been depicted as an ordinary operational amplifier and that is satisfactory for some applications. However, where high performance is desired, those skilled in the art will generally seek to utilize individually defined circuits for the two separate functions. Separate buffer and comparator circuits, however, may contribute to errors in the output signal as arising from different contributions due to input offset voltages. Advantages may be obtained from using a stage with a common input circuit for both functions, eliminating differences in input offset voltages. Such a stage 50 is shown in FIG. 5. A differential input circuit, or stage, 52 receives the input from the DAC 14 and the analog input signal AIN, via switch SW1. Stage 52 has a differential output, supplied in parallel to double pole-single throw switches SW6 and SW7; in turn, those switches feed buffer 54 and latch 56, respectively. The output of latch 56 is connected to drive SAR logic 16 and the buffer 54 provides the output from stage 50. Of course, switch SW6 is closed when the circuit is in hold mode and switch SW7 is closed when the circuit is in acquisition mode; thus, FIG. 5 depicts acquisition mode. Since the input stage is the same for both modes of operation, there is a first order reduction in the overall error contributed on the acquired voltage due to the input stage offset voltage. Thus the circuit provides a cancellation of the output contribution owing to input offset voltage. Moreover, this arrangement allows significantly different dynamic characteristics in the two operating modes. The capacitive compensation which is present in buffer in the hold mode need not slow down the comparator and the output voltage excursions may be limited by the latch, in comparator (acquisition) mode, without affecting hold mode performance.

It will be obvious to those skilled in the art that the invention may be embodied and implemented in many other forms than that illustrated, without departing from the spirit and teaching of this disclosure. The illustration used above assumes the input signal is a voltage, that it is sampled as a voltage, and that the output of the sample-and-hold circuits are voltages; however, those skilled in the art can quite easily assemble a like device using currents in place of one or more of said voltages. As an example of such a contemplated variation that will occur to those skilled in the art, it will be appreciated that the DAC may be any of a variety of DAC architectures, such as a resistor-string type of converter, an R-2R ladder type of converter or another type of DAC, and the ADC (illustrated as formed of a comparator and a successive approximation register) quite readily could be a type other than a successive approximation converter. Many variations on the specific embodiment illustrated, and other embodiments of the invention will be readily apparent to those skilled in the appropriate art; accordingly the invention is not limited to the embodiments hereinbefore described, such embodiments being presented by way of example only. Thus the invention is limited only as required by the following claims and equivalents thereto.

What is claimed is:

1. An infinite sample-and-hold circuit comprising:
   a. a digital-to-analog converter (DAC);
   b. an analog-to-digital converter (ADC), the ADC configured to receive and acquire a sample of an analog input signal and to provide to the digital-to-analog converter a digital code corresponding to a value of the sample, said digital-to-analog converter being connected to receive the digital code and provide a corresponding analog output value; and
   c. a mode control circuit connected between an analog input node, an output of the DAC and a node from which an output signal may be taken, and having
      a comparator/buffer receiving on a first input the analog output value provided by the digital-to-analog converter, receiving on a second input the analog input signal and providing an output, and wherein
      in a first mode of operation, the comparator/buffer provides as an output of the sample-and-hold circuit a buffered output of the analog output value from the digital-to-analog converter and provides in a second mode of operation a signal representing a comparison between the value of the analog input signal and the analog output value from the digital-to-analog converter, and wherein the comparator/buffer employs a common input circuit for both modes of operation, whereby substantially a same input offset is presented by said input circuit in both modes of operation.

2. The infinite sample-and-hold-circuit of claim 1 wherein the analog to digital converter includes a successive approximation register which provides the digital code, said code varying in response to an output from the comparator/buffer until the output from the digital-to-analog converter equals the analog input signal.

3. The infinite sample-and-hold circuit of either of claims 1 and 2 further including a path, actuable during a sample acquisition mode, and operatively connecting the analog input signal to a node of the circuit from which an output may be taken during a hold mode.

4. The infinite sample-and-hold circuit of either of claims 1 and 2 further including a buffer interposed between the analog input signal and an output node of the circuit during an acquisition mode of operation.

5. The infinite sample-and-hold circuit of either of claims 1 and 2 further including a buffer interposed between an output of the comparator/buffer and an output node of the circuit during a hold mode of operation.

6. The infinite sample-and-hold circuit of either of claims 1 and 2 further including means for isolating the output of the comparator/buffer from an output node of the circuit while the output of the comparator/buffer settles at the conclusion of an acquisition phase.

7. The infinite sample-and-hold circuit of either of claims 1 and 2 further including a switching mechanism which allows the analog input to be switched to an output node during acquisition, whereby the output signal may be controlled during acquisition and the output of the comparator/buffer is allowed to slew and settle from acquisition before being presented as an output.

8. An infinite sample-and-hold circuit (DAC) comprising:
   a. a digital-to-analog converter;
   b. an analog-to-digital converter (ADC), the ADC configured to receive and acquire a sample of an analog input signal and to provide to the digital-to-analog converter a digital code corresponding to a value of the sample, said digital-to-analog converter being connected to receive the digital code and provide a corresponding analog output value;
   c. a mode control circuit connected between an analog input node, an output of the DAC and a node from which an output signal may be taken, and having
      a comparator/buffer receiving on a first input the analog output value provided by the digital-to-analog converter, receiving on a second input the analog input signal and providing an output, and wherein
      in a first mode of operation, the comparator/buffer provides as an output of the sample-and-hold circuit a buffered output of the analog output value from the digital-to-analog converter and provides in a second mode of operation a signal representing a comparison between the value of the analog input signal and the analog output value from the digital-to-analog converter, and wherein the comparator/buffer employs a common input circuit for both modes of operation, whereby substantially a same input offset is presented by said input circuit in both modes of operation; and
      a switching mechanism which allows the analog input to be switched to an output node during acquisition, whereby the output signal may be controlled during acquisition and the output of the comparator/buffer is allowed to slew and settle from acquisition before being presented as an output.

* * * * *

UNITED STATES PATENT AND TRADEMARK OFFICE
CERTIFICATE OF CORRECTION

| | | |
|---|---|---|
| PATENT NO. | : 6,198,313 B1 | Page 1 of 1 |
| DATED | : March 6, 2001 | |
| INVENTOR(S) | : Patrick F. M. Poucher, Patrick Kirby, Christopher A. Kenny and Donal Geraghty | |

It is certified that error appears in the above-identified patent and that said Letters Patent is hereby corrected as shown below:

<u>Title page,</u>
Item [73], Assignee: should read -- Analog Devices, Inc., Norwood, Massachusetts --

Signed and Sealed this

Sixteenth Day of July, 2002

*Attest:*

JAMES E. ROGAN
*Attesting Officer*     *Director of the United States Patent and Trademark Office*